(12) United States Patent
Xu (10) Patent No.: US 10,734,253 B2
(45) Date of Patent: Aug. 4, 2020

(54) WAFER PROCESSING APPARATUS AND METHOD

(71) Applicant: JIANGSU LEUVEN INSTRUMENTS CO. LTD, Jiangsu (CN)

(72) Inventor: Kaidong Xu, Leuven (BE)

(73) Assignee: JIANGSU LEUVEN INSTRUMENTS CO. LTD, Jiangsu (CN)

( * ) Notice: Subject to any disclaimer, the term of this patent is extended or adjusted under 35 U.S.C. 154(b) by 0 days.

(21) Appl. No.: 16/196,349

(22) Filed: Nov. 20, 2018

(65) Prior Publication Data

US 2019/0088508 A1 Mar. 21, 2019

Related U.S. Application Data

(63) Continuation of application No. PCT/CN2017/083034, filed on May 4, 2017.

(30) Foreign Application Priority Data

May 24, 2016 (CN) .......................... 2016 1 0346135

(51) Int. Cl.
*H01L 21/67* (2006.01)
*H01L 21/02* (2006.01)
(Continued)

(52) U.S. Cl.
CPC .......... *H01L 21/67034* (2013.01); *B08B 3/02* (2013.01); *B08B 5/00* (2013.01);
(Continued)

(58) Field of Classification Search
CPC combination set(s) only.
See application file for complete search history.

(56) References Cited

U.S. PATENT DOCUMENTS 5,520,744 A * 5/1996 Fujikawa .......... H01L 21/02052
134/11
6,286,231 B1 * 9/2001 Bergman .......... H01L 21/67028
134/1.3
(Continued)

FOREIGN PATENT DOCUMENTS

CN 101210769 A 7/2008
CN 101329134 A 12/2008
(Continued)

OTHER PUBLICATIONS

International Search Report for PCT Application No. PCT/CN2017/083034; State Intellectual Property Office of P.R. China; Beijing, China; dated Aug. 8, 2017.
(Continued)

*Primary Examiner* — Erin F Bergner
(74) *Attorney, Agent, or Firm* — Thomas E. Lees, LLC (57) ABSTRACT

Disclosed is a wafer processing apparatus and method. The wafer processing apparatus comprises a chamber, which is a sealed structure having an openable baffle, and is internally provided with an immersion tank having a waste liquid discharge port; a vacuum system for adjusting and maintaining a pressure inside the chamber; a gas supply system comprising an inert gas supply unit and an organic solvent vapor supply unit respectively supplying an inert gas and an organic solvent vapor to the chamber; a temperature control system for adjusting the temperature inside the chamber. According to the present invention, the problems present in existing wafer drying modes can be solved, and in particular, the present invention is well adaptable to a trend of integrated circuit devices developed from a two-dimensional planar structure to a three-dimensional structure in morphology and having more and more increased density.

4 Claims, 7 Drawing Sheets

(51) Int. Cl.
  *B08B 3/02* (2006.01)
  *B08B 5/00* (2006.01)
(52) U.S. Cl.
  CPC .. *H01L 21/02046* (2013.01); *H01L 21/02052* (2013.01); *H01L 21/67017* (2013.01); *H01L 21/67028* (2013.01); *H01L 21/67057* (2013.01); *H01L 21/67115* (2013.01); *H01L 21/67248* (2013.01); *H01L 21/67253* (2013.01)

(56) References Cited

U.S. PATENT DOCUMENTS

2003/0124878 A1* 7/2003 Bae .................. H01L 21/67028 438/800
2004/0010932 A1* 1/2004 Chon ................ H01L 21/02052 34/267

FOREIGN PATENT DOCUMENTS

| CN | 101957124 A | 1/2011 |
| CN | 102148133 A | 8/2011 |
| CN | 103730331 A | 4/2014 |
| TW | 550694 B | 9/2003 |

OTHER PUBLICATIONS

Written Opinion of the International Searching Authority for PCT Application No. PCT/CN2017/083034; State Intellectual Property Office of the P.R. China; Beijing, China; dated Aug. 8, 2017.
Translation of the International Search Report for PCT Application No. PCT/CN2017/083034; State Intellectual Property Office of the P.R. China; Beijing, China; dated Aug. 8, 2017.
English Translation of the Written Opinion of the International Searching Authority for PCT Application No. PCT/CN2017/083034; International Searching Authority; dated Aug. 8, 2017.
International Preliminary Report on Patentability for PCT Application No. PCT/CN2017/083034; The International of WIPO; Geneva, Switzerland; dated Nov. 27, 2018.
Chinese Office Action for Chinese Patent Application No. 201610346135.2, State Intellectual Property Office of P.R. China; Beijing, China; May 27, 2019.

* cited by examiner

WAFER PROCESSING APPARATUS AND METHOD

CROSS REFERENCE TO RELATED APPLICATIONS

This is a Continuation application of International Application Serial No. PCT/CN2017/083034, filed May 4, 2017, which claims the benefit of Chinese Application No. 201610346135.2, filed May 24, 2016, the disclosures of which are hereby incorporated by reference.

BACKGROUND

The present disclosure relates to the field of large scale integrated circuit manufacturing, and in particular to a wafer processing apparatus and method.

Both a large-scale advanced integrated circuit manufacturing and a small batch of research and development type micro-nano processing involve wet etching and cleaning process. The wet process is generally divided into three parts: chemical liquid soaking, deionized water washing, and final drying.

The main methods of drying are as follows:

1. Mechanical drying represented by SEMITOOL SRD (registered trademark)

The drying method is to throw most of water out of a wafer surface in a short time (~5 minutes) by centrifugal force, and then dry it in the form of evaporation by hot nitrogen for a long time (~25 minutes). Because of the mechanical rotation, the wafer will accumulate lots of static electricity, and despite the remedial measures such as Electrostatic neutralization, it will still be affected by the particles. If it is a hydrophobic surface, the particle problem can be very serious. In addition, this manner of mechanical rotation plus evaporation by blowing heat $N_2$ is not suitable for drying many high line-width ratio structures and microelectromechanical systems (MEMS) devices, in which the capillary force in the process of water evaporation will directly pulls weak structures thereof and cause permanent defects such as adhesions. Furthermore, since the manner involves a mechanical rotation with a center of the wafer as an axis, the centrifugal force at the central portion of the wafer is close to zero, so this drying manner is difficult to adapt to the post-hydrofluoric acid (HF-last) wafer. Because water droplets in the center part can only be dried in the hot $N_2$ step for a long time, and a machine is not completely isolated from the outside, the residual $O_2$ and water droplets in the machine can easily form defects called water marks on a hydrophobic surface.

2. Steam drying by replacing moisture on a surface of a wafer with an organic solvent vapor of low surface tension A typical example is isopropyl alcohol (IPA) steam drying invented by Professor T. Ohmi and others of Waseda University, Japan. As shown in Table 1, at 25° C., the surface tension of IPA is less than ⅓ of water, so the capillary force at the time of evaporating is much smaller than water, and their boiling point is lower than water (Table 2), there is very high steam pressure, which helps evaporate for drying.

TABLE 1

Surface tension of various liquids at different temperatures

| Molecular formula | name | γ (mN/m) | | | | |
|---|---|---|---|---|---|---|
| | | 10° C. | 25° C. | 50° C. | 75° C. | 100° C. |
| $Br_2$ | Bromine | 43.68 | 40.95 | 36.40 | | |
| $H_2O$ | water | 74.23 | 71.99 | 67.94 | 63.57 | 58.91 |
| $H_4N_2$ | hydrazine | | 66.39 | | | |
| Hg | mercury | 488.55 | 485.48 | 480.36 | 475.23 | 470.11 |
| $CH_4O$ | Methanol | 23.23 | 22.07 | 20.14 | | |
| $C_2H_6O$ | Alcohol | 23.22 | 21.97 | 19.89 | | |
| $C_2H_6O_2$ | ethylene glycol | | 47.99 | 45.76 | 43.54 | 41.31 |
| $C_3H_6O$ | acetone | 24.57 | 22.72 | 19.65 | | |
| $C_3H_8O$ | propanol | 24.48 | 23.32 | 21.38 | 19.43 | |
| $C_3H_8O$ | isopropanol | 22.11 | 20.93 | 18.69 | 16.98 | |

TABLE 2

Boiling point of various liquids at different pressures

| Molecular formula | name | temperature (° C.) | | | | | |
|---|---|---|---|---|---|---|---|
| | | 1 Pa | 10 Pa | 100 Pa | 1 kPa | 10 kPa | 100 kPa |
| $C_3H_8O$ | isopropanol | −65e | −49e | −28e | −1.3 | 33.6 | 82.0 |
| $CH_4O$ | Methanol | −87e | −69e | −47.5 | −20.4 | 15.2 | 64.2 |
| $C_2H_6O$ | Alcohol | −73e | −56e | −34e | −7e | 29.2 | 78 |
| $H_2O$ | water | −60.7 s | −42.2 s | −20.3 s | 7.0 | 45.8 | 99.6 |
| $C_3H_6O$ | Acetone | −95 | −81.8 | −62.8 | −35.6 | 1.3 | 55.7 |
| $C_3H_8O$ | propanol | −54e | −38e | −16e | 10e | 47e | 96.9 |

Where e is an abbreviation for evaporation, indicating that the liquid begins to evaporate; s is an abbreviation for solid, indicating that the liquid is still in a solid state.

Although it has the advantages of high-volume drying of wafers, no static interference, low particles, etc., due to the high IPA temperature (82° C., IPA boiling point at atmospheric pressure), the safety requirements are extremely high. Because a pure evaporation mode is employed, the process time is much longer than mechanical drying, and it consumes more IPA and sometimes leaves organic residues.

3. The Marangoni principle drying method invented by Philips in the Netherlands

After the wafer is placed in the water tank, while it slowly floats out of the water, an organic solvent vapor of low surface tension, such as IPA, is fed. Because IPA and water are miscible, the concentration of IPA close to the wafer is higher than the concentration of IPA in the sink. This creates a surface tension gradient between the surface of the wafer and the sink, and the direction is from the wafer to the sink. The moisture on the surface of the wafer is gradually pulled to the sink by the Marangoni effect, so as to achieve drying effect. The Marangoni principle drying has low consumption of IPA (20~30 mL/time), short process time (10~20 minutes), and is accomplished at room temperature, so it has become a main drying method in the relevant field. Because the water is taken away by the physical force of the Marangoni effect, this drying method has a very perfect effect in avoiding water marks. However, the Marangoni effect can only form a surface tension gradient on a relatively smooth and hydrophilic surface, so this drying manner is difficult to apply to devices or structures that are relatively sensitive to capillary forces or of high line-width ratios, such as MEMS, TSV, and the like. Since it is only an imitation of an IPA steam dryer at that time, and it works at a room temperature, frequently, the wafer can not be completely dried. If it is a hydrophobic surface, it is also difficult to form an effective surface tension gradient and the drying mode will also become an IPA vapor drying, with the addition of the condition being normal temperature, normal pressure, and non-isolation from the outside, the wafer surface is easily oxidized by oxygen, which is easy to form water marks.

4. Supercritical drying

The last method is supercritical drying that can only be used for release in small volume MEMS manufacturing processes. This drying method bypasses critical points of the three phases of the water, directly sublimates it, avoiding problems such as adhesion caused by capillary force, and is commonly used in the manufacture of MEMS devices. However, because of the large amount of liquid $CO_2$ used and a long process time (~1 hour), it is not able to be used in an integrated circuit process.

As an overview of the advantages and disadvantages of the above drying machines, and in view of a trend that the morphology of integrated circuit devices develops from two-dimensional planar structure to three-dimensional structure, such as dense fin field effect transistor (Fin-FET), high line-width ratio DRAM, nanowire field effect transistor, etc., more wafers are stacked vertically in the package such as TSV, and the density of high line-width ratio (AR) deep trench structure in the wafer is getting higher and higher, so it is necessary to develop an efficient drying method that can meet the demand.

BRIEF SUMMARY

In order to solve the above problems, the present disclosure provides a wafer processing apparatus comprising: a chamber which is a sealed structure having an openable baffle, and is internally provided with an immersion tank having a waste liquid discharge port; a vacuum system for adjusting and maintaining a pressure in the chamber; a gas supply system comprising an inert gas supply unit and an organic solvent vapor supply unit for respectively supplying an inert gas and an organic solvent vapor to the chamber; and a temperature control system for adjusting the temperature inside the chamber.

Preferably, a wafer cassette is detachably disposed in the chamber, and a wafer is perpendicular to a horizontal plane in the case of being placed in the wafer cassette.

Preferably, the vacuum system comprises a pressure sensor, a vacuum pump, and a display device, wherein the pressure sensor is disposed in the chamber to detect a pressure of the chamber, and the display device displays the data detected by the pressure sensor.

Preferably, the inert gas supply unit comprises a gas storage tank, a gas filter, and a first gas flow meter; the organic solvent vapor supply unit comprises a second gas flow meter, a liquid storage tank, a liquid flow meter, an atomizing device, a thermostat, wherein the second gas flow meter is connected to the gas filter, the liquid storage tank is connected to the liquid flow meter, and the second gas flow meter and the liquid flow meter are respectively connected to the atomizing device; the thermostat adjusts the temperature of the organic solvent vapor to make it enter the chamber in a vapor state; wherein at least one of the inert gas supply unit and the organic solvent vapor supply unit has a spraying head, the spraying head is disposed in the chamber, and the atomizing device and the first gas flow meter are connected to the spraying head.

Preferably, the temperature control system comprises at least a heat radiation device.

The present disclosure also provides a wafer processing method comprising the steps of: a loading step of loading a wafer in an immersion tank pre-filled with ultrapure water in a manner perpendicular to a horizontal plane; a flushing step of rapidly flushing the wafer to remove residual chemical liquid on a surface of the wafer; an inert gas drying step of closing a baffle and introducing an inert gas into a chamber through an inert gas supply unit at the same time of discharging the ultrapure water in the immersion tank, and maintaining an internal pressure intensity inside the chamber at a first pressure intensity, wherein the first pressure intensity is not less than an external pressure intensity outside the chamber; an organic solvent vapor drying step of introducing an organic solvent vapor into the chamber through an organic solvent vapor supply unit and reducing the internal pressure intensity inside the chamber from the first pressure intensity to a second pressure intensity for a preset process time after the water in the immersion tank has been completely drained off; an increased temperature drying step of stopping a supply of gas and raising the temperature inside the chamber up to a preset temperature by a temperature control system; and a wafer taking-out step of introducing an inert gas into the chamber through the inert gas supply unit until the pressure intensity inside the chamber equals to the external pressure intensity outside the chamber, and taking out the wafer.

Preferably, the organic solvent vapor drying step comprises: a constant pressure drying step of maintaining a pressure intensity inside the chamber at a first pressure intensity for a redetermined time at the same time of introducing an organic solvent vapor into the chamber; and a decreased pressure drying step of gradually reducing the pressure intensity inside the chamber from the first pressure intensity to the second pressure intensity at the same time of introducing the organic solvent vapor into the chamber.

Preferably, the step of introducing the organic solvent vapor into the chamber comprises the steps of: introducing the inert gas and the organic solvent vapor into the atomizing device via the gas flow meter and the liquid flow meter, respectively, and adjusting the temperature through the thermostat to make the organic solvent contact the surface of the wafer uniformly in a vapor form via the spraying head.

Preferably, the second pressure is 1 kPa.

Preferably, the inert gas is nitrogen, and the organic solvent vapor is isopropanol vapor.

DETAILED DESCRIPTION

The technical solutions of the embodiments of the present invention will be clearly and completely described in the following with reference to the accompanying drawings in the embodiments of the present invention. It should be appreciated that the specific embodiments described herein are only intended to illustrate the invention rather than limit the invention. The described embodiments are only parts of embodiments of the invention rather than all embodiments. All other embodiments obtained by those skilled in the art based on the embodiments of the present invention without creative efforts are within the scope of the present invention.

Figure 1:
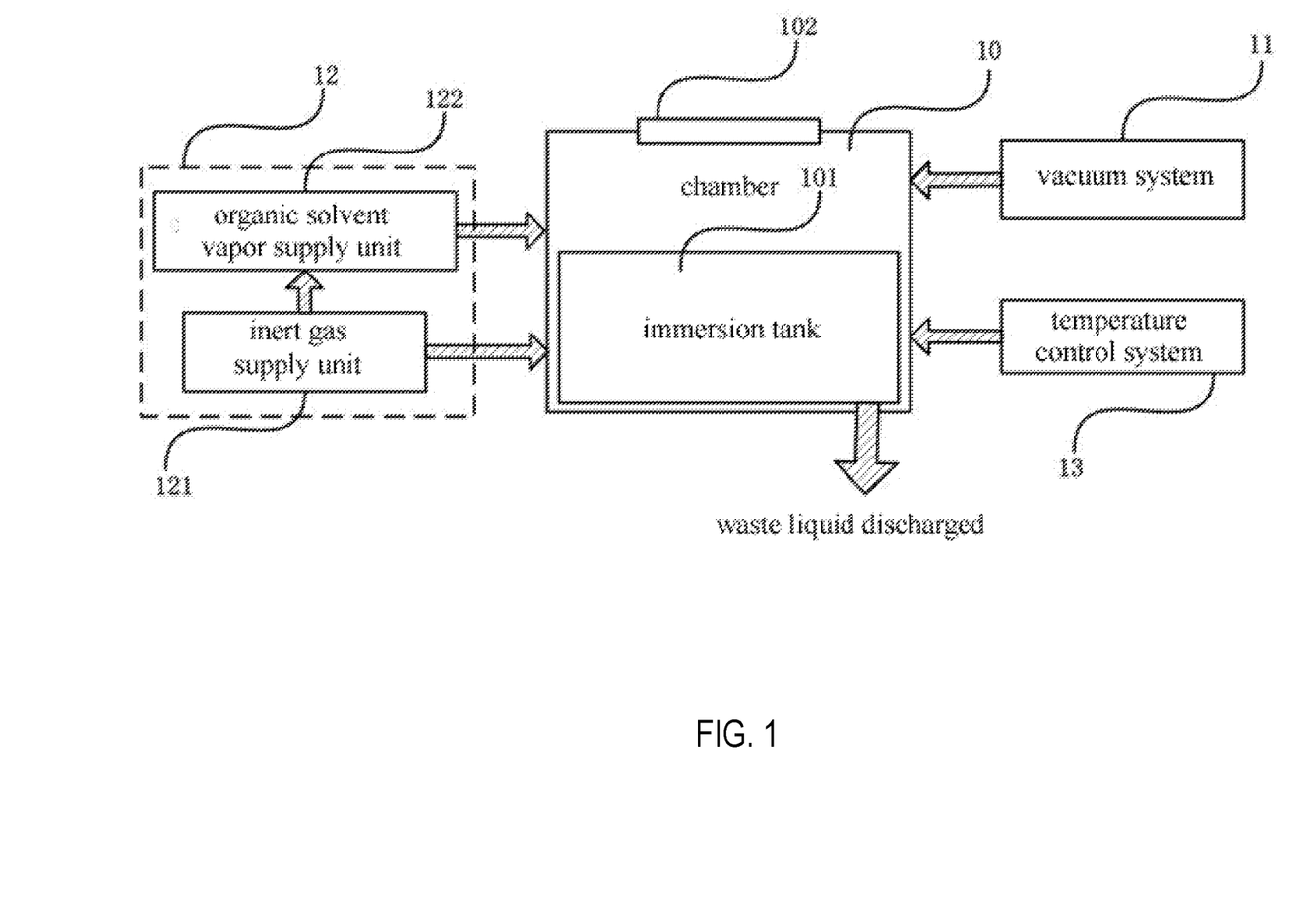
FIG. 1 is a functional block diagram of a wafer processing apparatus.

As shown in FIG. 1, a wafer processing apparatus comprises: a chamber 10, which is a sealed structure with an openable baffle 102, and an immersion tank 101 being disposed inside the chamber 10, wherein the dipping tank 101 has a waste liquid discharge port; a vacuum system 11 for adjusting and maintaining a pressure intensity inside the chamber 10; a gas supply system 12 including an inert gas supply unit 121 and an organic solvent vapor supply unit 122 for respectively supplying inert gas and organic solvent vapor to the chamber 10; a temperature control system 13 for adjusting a temperature inside the chamber 10.

Preferably, a wafer cassette (not shown) is disposed in the chamber 10 in a detachable manner, and when a wafer is placed in the wafer cassette, it is perpendicular to the horizontal plane, so that water, residual chemical liquid, etc. can be drained off by virtue of gravity.

Preferably, the immersion tank 101 is previously subjected to a hydrophobic treatment, for example, a layer of perfluoroalkoxy alkane (PFA) polymer film is coated thereon.

Figure 2:
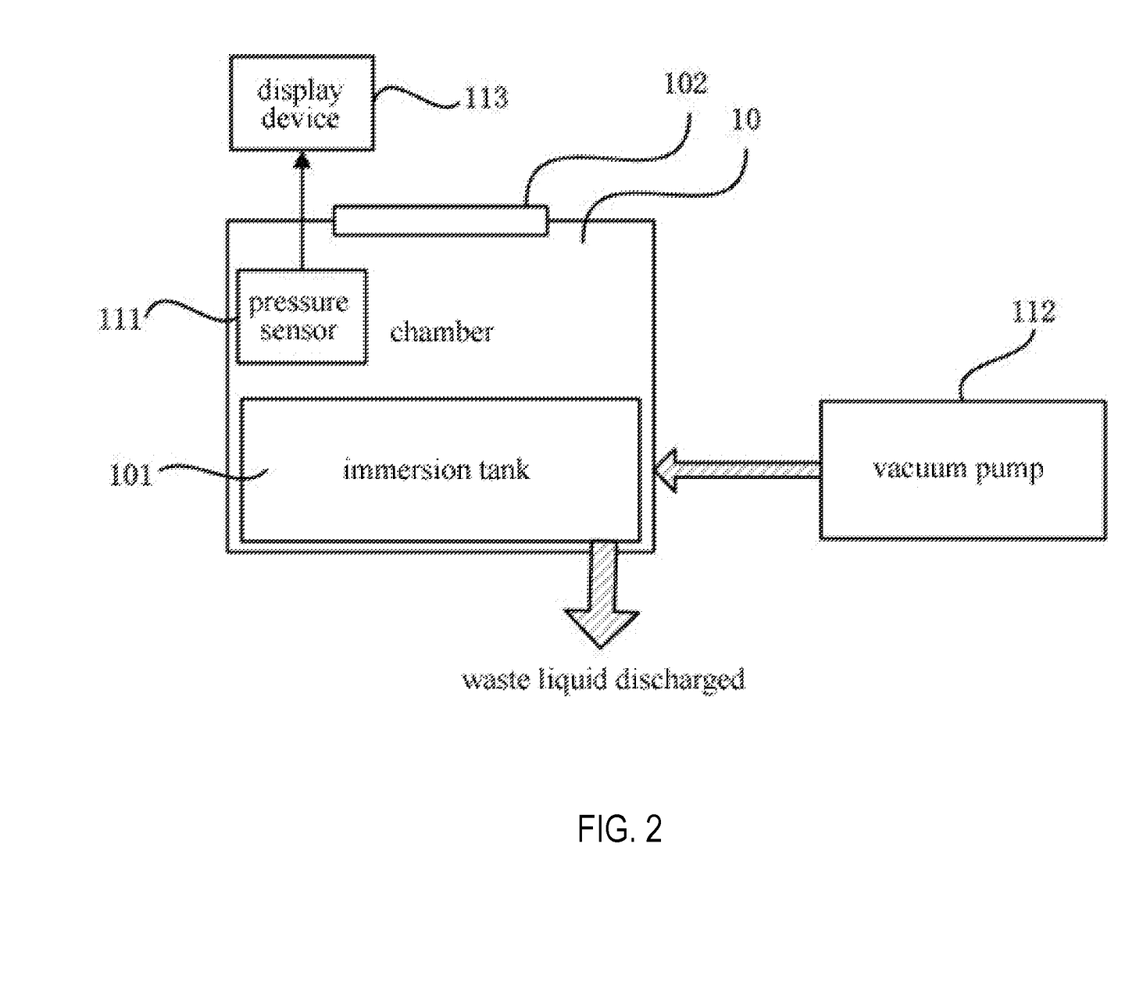
FIG. 2 is a functional block diagram showing a vacuum system and its connection to a chamber.

Preferably, as shown in FIG. 2, the vacuum system 11 includes a pressure sensor 111, a vacuum pump 112, and a display device 113. The pressure sensor 111 is disposed in the chamber 10 to detect the pressure inside the chamber 10, and the display device 113 displays the data measured by the sensor 111. The vacuum system 11 for example may further comprise a control means connecting to the pressure sensor 111 and the vacuum pump 112 respectively and controlling the vacuum pump 112 based on the feedback data from the pressure sensor 111. The vacuum pump 112 may be, for example, a smart vacuum pump, that is, connected to the pressure sensor 111, and adjusts the operation mode or the like of the vacuum pump 112 based on the data detected by the pressure sensor 111. Of course, the present invention is not limited thereto, and the vacuum system may be any vacuum system commonly used in the art as long as it can adjust and maintain the pressure of the chamber.

Figure 3:
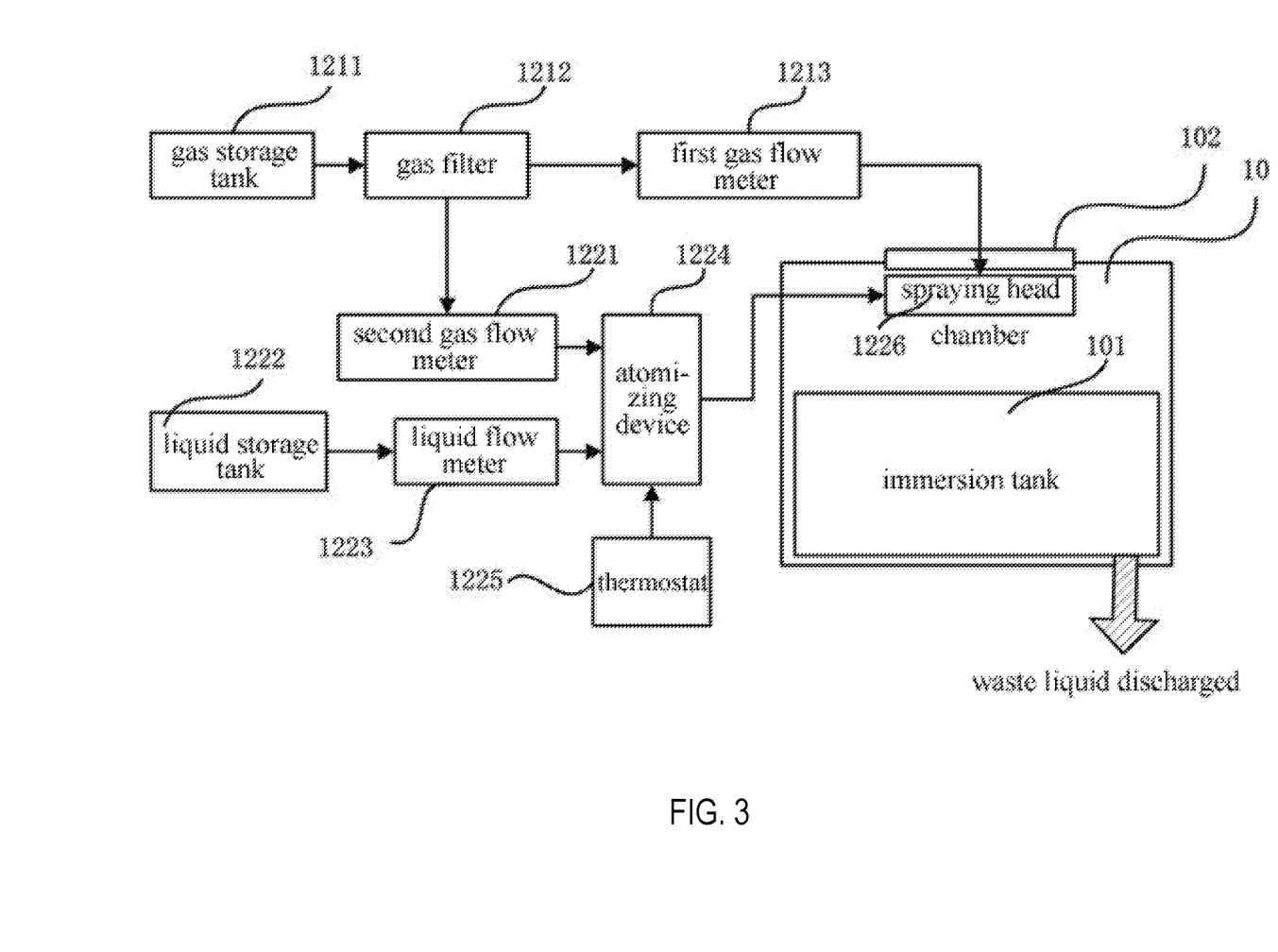
FIG. 3 is a functional block diagram showing a gas supply system and its connection to the chamber.

Preferably, as shown in FIG. 3, the inert gas supply unit 121 includes a gas storage tank 1211, a gas filter 1212, and a first gas flow meter 1213. The organic solvent vapor supply unit 122 includes a second gas flow meter 1221, a liquid storage tank 1222, a liquid flow meter 1223, an atomizing device 1224, a thermostat 1225, and a spraying head 1226.

The gas storage tank 1211, the gas filter 1212, the first gas flow meter 1213, and the spraying head 1226 are sequentially connected. The second gas flow meter 1221 is connected to the gas filter 1212, the liquid flow meter 1223 is connected to the liquid storage tank 1222, and the second gas flow meter 1221 and the liquid flow meter 1223 are connected to the atomizing device 1224, respectively.

The thermostat 1225 adjusts the temperature of the organic solvent vapor. For example, the thermostat may include a heating device, a testing device, and an adjusting device. Alternatively, it can be any other suitable temperature controller, as long as the temperature of the organic solvent vapor in the atomizing device as well as during the process of entering the chamber from the atomizing device is controlled at 30° C. or above, and the organic solvent is ensured to uniformly contact the surface of the wafer in the form of steam through the spraying head 1226.

The spraying head 1226 is disposed within the chamber 10, and the atomizing device 1224 is connected to the spraying head 1226. The organic solvent vapor from the atomizing device is in uniform contact with the wafer surface through the spraying head 1226.

It should be noted that in the above embodiment, the organic solvent vapor supply unit is described as including a spraying head shared with the inert gas supply unit. However, the present invention is not limited thereto, and in some embodiments, it may be possible that the inert gas supply unit includes a spraying head shared with the organic solvent vapor supply unit, or that the organic solvent vapor supply unit and the inert gas supply unit may have a spraying head respectively, or the like. In short, those selections or modifications easily considered and made by those skilled in the art according to actual circumstances in the light of the present disclosure are within the scope of the present invention.

Figure 4:
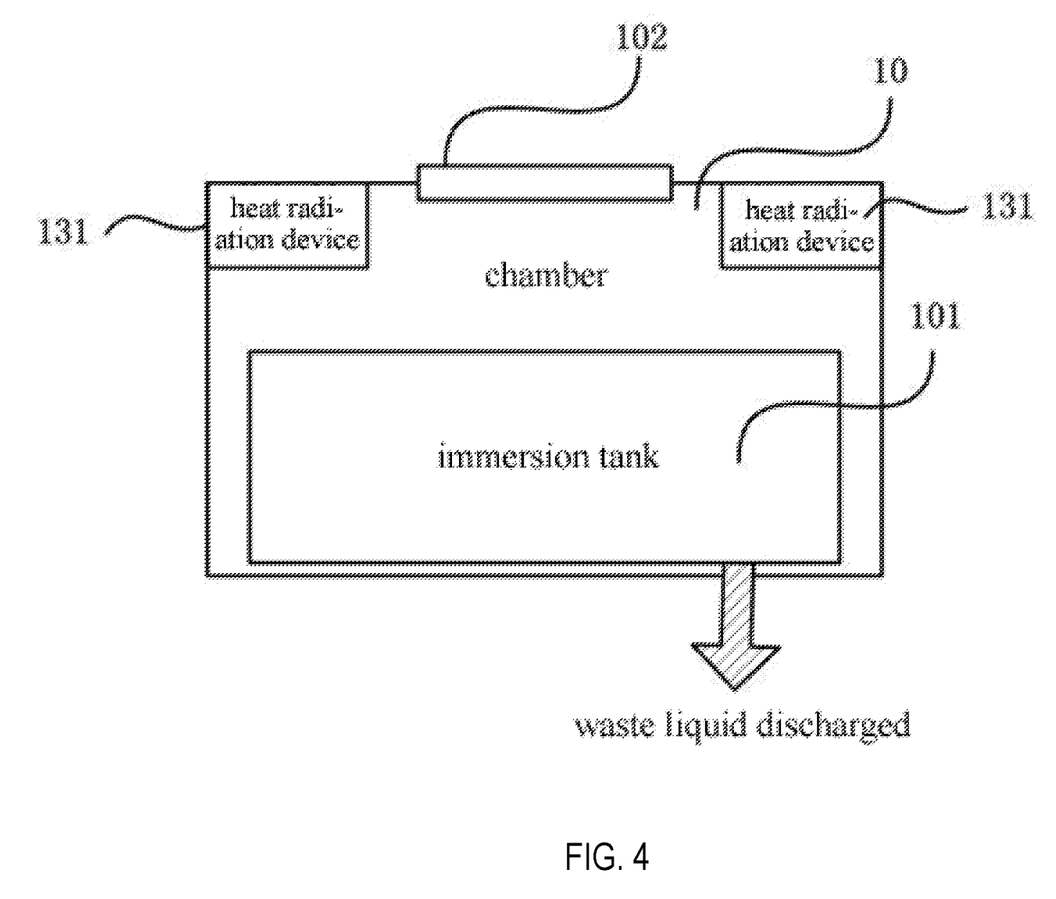
FIG. 4 is a functional block diagram showing an embodiment of a temperature control system and its connection to the chamber.
Figure 5:
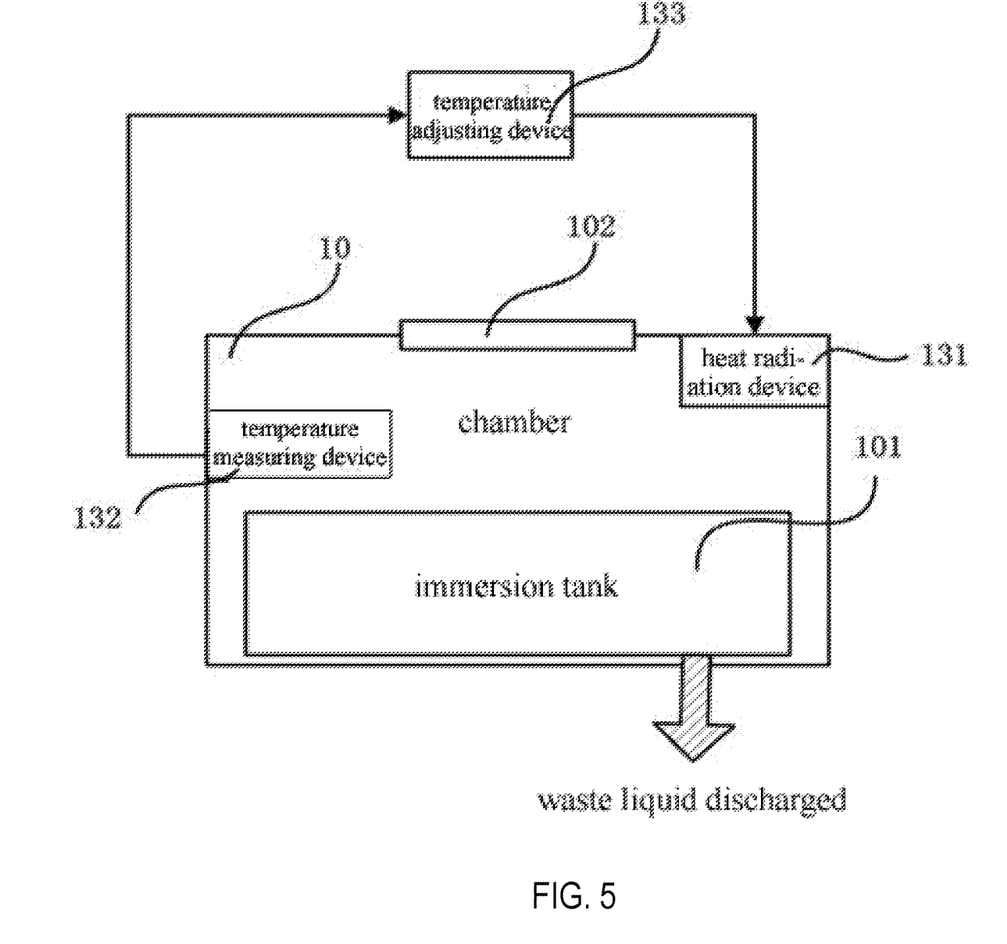
FIG. 5 is a functional block diagram showing another embodiment of a temperature control system and its connection to the chamber.

Preferably, the temperature control unit 13 may, for example, includes one or more heat radiation devices 131, which may for example be infrared light tubes. In one embodiment, as shown in FIG. 4, two heat radiating devices 131 are disposed within the chamber 10 to provide a faster temperature rise throughout the chamber and a more uniform temperature. In another embodiment, as shown in FIG. 5, the temperature control unit 13 includes a heat radiation device 131, a temperature measuring device 132, and a temperature adjusting device 133, wherein the heat radiation device 131 and the temperature measuring device 132 are respectively connected with the temperature adjusting device 133, and the temperature adjusting device 133 controls the thermal radiation device based on the data fed back by the temperature measurement device 132.

Figure 6:
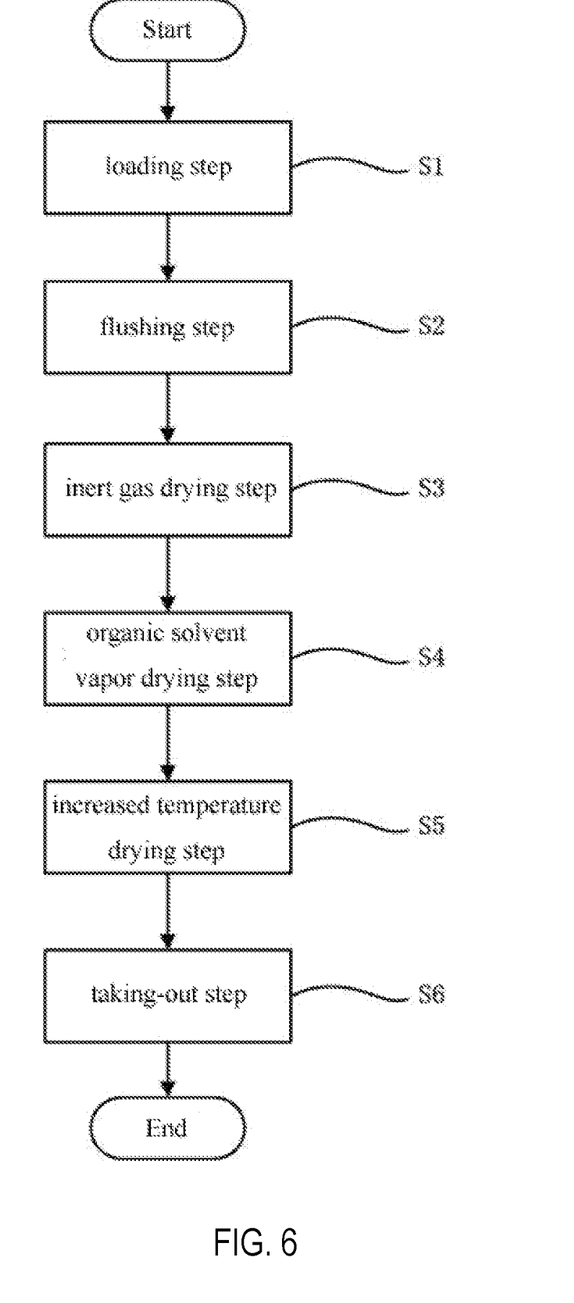
FIG. 6 is a flow chart of a wafer processing method.

Next, an embodiment of a wafer processing method will be described. As shown in FIG. 6, the wafer processing method comprises the following steps:

a loading step S1: immersing a wafer in a manner perpendicular to the horizontal plane into an immersion tank 101 pre-filled with ultrapure water.

a flushing step S2: the wafer is quickly flushed or overflowed to remove residual chemical liquid on the wafer surface.

an inert gas drying step S3: closing the baffle 102, and introducing an inert gas into the chamber 10 through the inert gas supply unit 121 while discharging the ultrapure water in the immersion tank 101, and maintaining the internal pressure intensity for the chamber 10 at a first pressure intensity. The first pressure intensity is not less than an external pressure intensity, thereby preventing oxygen in the air from entering the chamber, and generally can be 1 standard atmospheric pressure.

an organic solvent vapor drying step S4: when the water in the immersion tank 101 is completely drained off, the organic solvent vapor is introduced into the chamber 10 through the organic solvent vapor supply unit 122, and the pressure in the chamber is reduced from the first pressure to a second pressure during a preset process time. Preferably, the second pressure intensity is 1 kPa.

Figure 7:
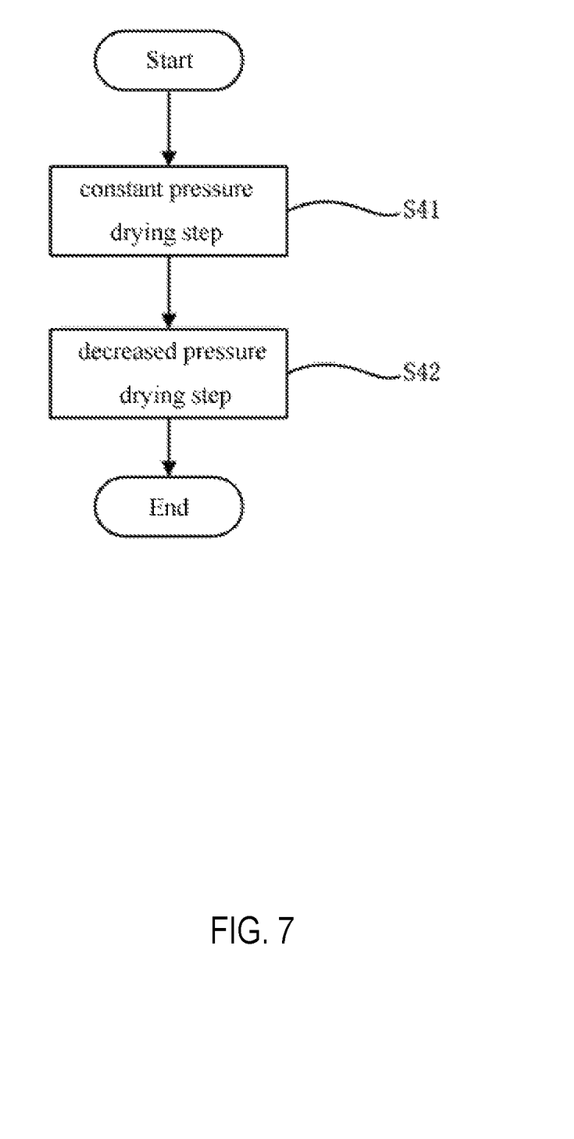
FIG. 7 is a flow chart of an organic solvent vapor drying step.

More specifically, as shown in FIG. 7, the inert gas drying step S4 comprises the following steps:

a constant pressure drying step S41: the pressure intensity in the chamber 10 is maintained at the first pressure intensity for a predetermined time while the organic solvent vapor is introduced into the chamber 10 through the inert gas supply unit 121. If the wafer is a regular wafer of smooth surface, for the reason that the IPA is miscible with the water on the surface of the wafer and the top of the wafer contacts the IPA vapor earlier than the bottom thereof, an IPA concentration at the top of the wafer is always slightly higher than an IPA concentration below the wafer. Thus, a surface tension gradient is formed above and below the wafer in a direction from top to bottom. As a result, the water on an upper portion of the wafer will be quickly pulled to a bottom portion of the wafer by the Marangoni effect. In the case of a three-dimensional complex structure, the IPA and water mutually dissolved slowly to form an azeotrope. At a higher vapor pressure such as the first pressure intensity, usually 1 standard atmosphere pressure, most of the water is taken away by evaporation in the form of an azeotrope.

a decreased pressure drying step S42: gradually reducing the pressure intensity in the chamber 10 from the first pressure intensity to the second pressure intensity while introducing an organic solvent vapor into the chamber 10. Since the boiling point of the azeotrope is directly related to the pressure, it is possible to control and accelerate the evaporation of a small amount of water by reducing the pressure in the chamber.

Specifically, introducing the organic solvent vapor into the chamber 10 specifically comprises the following steps:

entering the inert gas and the organic solvent vapor into the atomizing device 1224 via the second gas flow meter 1221 and the liquid flow meter 1223, respectively, and adjusting the temperature by the temperature controller 1225, so that the organic solvent passes through the spraying head 1226 in the form of steam and contacts with the surface of the wafer uniformly.

an increased temperature drying step S5: the gas supply is stopped, and the temperature inside the chamber 10 is raised to a preset temperature by the temperature control system 13. As shown in Table 2, when the pressure intensity is 1 KPa, the boiling point of water is 7° C., so the residual moisture will also be evaporated completely. For example, the temperature of an infrared light tube is raised to a preset temperature and maintained for 2 minutes, and the temperature can be set according to the requirements of the pressure, the specific processes, and the like. According to the BET (Brunauer-Emmett-Teller) equation, the desorption rate of molecules including water and IPA is greatly increased, so that no organic residue will be left.

a taking-out step S6: the inert gas is introduced into the chamber 10 through the inert gas supply unit 121 until the pressure intensity inside the chamber 10 equals to the external pressure intensity outside the chamber 10, typically 1 standard atmospheric pressure; and the wafer is taken out.

In any of the above embodiments, the organic solvent vapor is preferably isopropanol vapor, and the inert gas is preferably nitrogen.

The above are only specific embodiments of the present invention, but the scope of the present invention is not limited thereto, and any changes or substitutions easily considered and made by a person skilled in the art in the light of the present disclosure should also be regarded as within the scope of the present invention.

What is claimed is:

1. A wafer processing method, comprising:
    a loading step of loading a wafer in an immersion tank pre-filled with ultrapure water in a manner perpendicular to a horizontal plane;
    a flushing step of rapidly flushing the wafer to remove residual chemical liquid on a surface of the wafer;
    an inert gas drying step of closing a baffle and introducing an inert gas into a chamber through an inert gas supply unit while discharging the ultrapure water in the immersion tank, and maintaining an internal pressure intensity inside the chamber at a first pressure intensity, wherein the first pressure intensity is not less than an external pressure intensity outside the chamber;
    an organic solvent vapor drying step of introducing an organic solvent vapor into the chamber through an organic solvent vapor supply unit and reducing the internal pressure intensity inside the chamber from the first pressure intensity to a second pressure intensity for a preset process time, after the water in the immersion tank has been drained off completely, wherein the organic solvent vapor drying step comprises:
        a constant pressure drying step of maintaining a pressure intensity inside the chamber at the first pressure intensity for a predetermined time at the same time of introducing the organic solvent vapor into the chamber;
        a decreased pressure drying step of gradually reducing the pressure intensity inside the chamber from the first pressure intensity to the second pressure intensity at the same time of introducing the organic solvent vapor into the chamber; and
        controlling and accelerating evaporation of a small amount of water by the reducing of the pressure intensity inside the chamber;
    an increased temperature drying step of stopping the supply of gas and raising the temperature inside the chamber up to a preset temperature by a temperature control system; and
    a wafer taking-out step of introducing an inert gas into the chamber through the inert gas supply unit until the pressure intensity inside the chamber equals to the external pressure intensity outside the chamber, and taking out the wafer.

2. The wafer processing method according to claim 1, wherein the step of introducing the organic solvent vapor into the chamber comprises:
    introducing the inert gas and the organic solvent vapor into an atomizing device via a gas flow meter and a liquid flow meter, respectively, and adjusting the temperature by a thermostat to make the organic solvent contact the surface of the wafer uniformly in the form of steam via a spraying head.

3. The wafer processing method according to claim 1, wherein
    the second pressure intensity is 1 kPa.

4. The wafer processing method according to claim 1, wherein
    the inert gas is nitrogen, and the organic solvent vapor is isopropanol vapor.

* * * * *